United States Patent
Wada

(10) Patent No.: US 8,669,695 B2
(45) Date of Patent: Mar. 11, 2014

(54) PIEZOELECTRIC GENERATING ELEMENT AND METHOD FOR ESTIMATING POWER GENERATION AMOUNT OF PIEZOELECTRIC GENERATING ELEMENT

(71) Applicants: Murata Manufacturing Co., Ltd., Nagaokakyo (JP); TDK Corporation, Tokyo (JP); Fuji Ceramics Corporation, Shizuoka (JP)

(72) Inventor: Satoshi Wada, Kofu (JP)

(73) Assignees: Murata Manufacturing Co., Ltd., Nagaokakyo-Shi, Kyoto-Fu (JP); TDK Corporation, Tokyo (JP); Fuji Ceramics Corporation, Fujinomiya-Shi, Shizuoka (JP)

( * ) Notice: Subject to any disclaimer, the term of this patent is extended or adjusted under 35 U.S.C. 154(b) by 0 days.

(21) Appl. No.: 13/859,905

(22) Filed: Apr. 10, 2013

(65) Prior Publication Data
US 2013/0229090 A1  Sep. 5, 2013

Related U.S. Application Data

(63) Continuation of application No. PCT/JP2011/074705, filed on Oct. 26, 2011.

(30) Foreign Application Priority Data

Oct. 28, 2010 (JP) .................. 2010-241988
Oct. 20, 2011 (JP) .................. 2011-230753

(51) Int. Cl.
*H01L 41/08* (2006.01)
(52) U.S. Cl.
USPC .......................... 310/358; 310/339

(58) Field of Classification Search
USPC .............. 310/339, 357–359; 252/62.9 PZ
See application file for complete search history.

(56) References Cited

U.S. PATENT DOCUMENTS

| | | | | |
|---|---|---|---|---|
| 5,657,063 A | * | 8/1997 | Takahashi | 347/69 |
| 2006/0246490 A1 | * | 11/2006 | Anderson et al. | 435/6 |
| 2012/0177907 A1 | | 7/2012 | Koike et al. | |

FOREIGN PATENT DOCUMENTS

| | | |
|---|---|---|
| JP | 2003009552 A | 1/2003 |
| JP | 2003183073 A | 7/2003 |
| JP | 2009239245 A | 10/2009 |
| JP | 2011-086924 A | 4/2011 |
| JP | 2011216661 A | 10/2011 |

OTHER PUBLICATIONS

International Search Report and Written Opinion, issued in PCT/JP2011/074705, mailed Nov. 29, 2011.

* cited by examiner

*Primary Examiner* — Mark Budd
(74) *Attorney, Agent, or Firm* — Dickstein Shapiro LLP

(57) ABSTRACT

Provided is a piezoelectric generating element having an electrode on an outer surface of a piezoelectric ceramic body, wherein the piezoelectric ceramic body has a relative permittivity of 110 to 1700, an elastic compliance of 15 to 150 $pm^2/N$, and a void ratio of 20 to 75%. Preferably, the void ratio is 50 to 75% in the piezoelectric generating element. A crystal particle is modeled as a cube with a length X on a side, a virtual void portion is provided in cube, a void ratio x is calculated based on a thickness t of a frame excluding void portion, a relative permittivity $\epsilon r$ and an elastic compliance s are calculated based on void ratio x, and a power generation amount P is estimated. Thereby, a piezoelectric generating element capable of significantly increasing a power generation amount more than before, and a method for estimating a power generation amount of the piezoelectric generating element can be obtained.

7 Claims, 4 Drawing Sheets

PIEZOELECTRIC GENERATING ELEMENT AND METHOD FOR ESTIMATING POWER GENERATION AMOUNT OF PIEZOELECTRIC GENERATING ELEMENT

This is a continuation of application Serial No. PCT/JP2011/074705, filed Oct. 26, 2011, the entire contents of which is incorporated herein by reference.

TECHNICAL FIELD

The present invention relates to a piezoelectric generating element, and a method for estimating the amount of power generation of the piezoelectric generating element. More specifically, the present invention relates to a piezoelectric generating element using a piezoelectric ceramic material, and a method for estimating the power generation amount of the piezoelectric generating element.

BACKGROUND ART

When a stress is applied to a piezoelectric element formed of a piezoelectric ceramic material to minutely vibrate the piezoelectric element, an electromotive force is generated. A piezoelectric generating element is an element utilizing the electromotive force generated described above, and various types of piezoelectric generating elements have conventionally been proposed.

For example, Patent Document 1 proposes an element for piezoelectric generation comprising a piezoelectric element having a unimorph structure in which a rectangular plate-shaped single piezoelectric element having electrodes on both surfaces thereof is bonded to an elastic plate, or having a bimorph structure or a stacked structure in which at least two or more piezoelectric elements are bonded with an elastic plate interposed therebetween, wherein the piezoelectric element has one end as a fixed end and the other end as a free end, a certain weight is attached to the free end, and the entire element is sealed in a container with a space in which the free end is allowed to deflect to a certain degree.

In Patent Document 1, one end of the piezoelectric element is fixed, the other (free) end is provided with the weight, an external force is applied to the piezoelectric element to vibrate it using the inertial force of the weight, and thereby power is generated.

Further, Patent Document 2 proposes a piezoelectric ceramic element for power generation obtained by mixing ceramic materials for a piezoelectric element such as lead titanate and lead zirconate and sintering the mixture, wherein a fiber material having a melting point higher than the sintering temperature and having a high tensile strength is mixed as a bonding agent for preventing cracks, in addition to particle powders of various types of ceramic materials constituting the element.

In Patent Document 2, the fiber material having a melting point higher than the sintering temperature and having a high tensile strength is mixed into between ceramic particles. This prevents the piezoelectric ceramic element from being broken when vibration is applied thereto.

CITATION LIST

Patent Documents

Patent Document 1: Japanese Patent Laying-Open No. 2003-9552
Patent Document 2: Japanese Patent Laying-Open No. 2003-183073

SUMMARY OF INVENTION

Technical Problem

Although the conventional piezoelectric generating elements described in Patent Documents 1 and 2 are intended to obtain an electromotive force by minute vibration of the piezoelectric element, only a weak electromotive force can be obtained, and thus only an extremely small power generation amount can be obtained. Therefore, it has been difficult to put these elements to practical use.

The present invention has been made in view of such circumstances, and one object of the present invention is to provide a piezoelectric generating element capable of significantly increasing the power generation amount more than before, and a method for estimating the power generation amount of the piezoelectric generating element.

Solution to Problem

The inventor of the present invention has conducted an earnest study to achieve the above object, and found that there is a certain relationship between the power generation amount and material constants of a piezoelectric ceramic material, that is, the piezoelectric constant, relative permittivity, and elastic compliance, and that, in particular, the power generation amount is increased by decreasing the relative permittivity and increasing the elastic compliance.

The inventor of the present invention has intentionally provided a piezoelectric ceramic body with voids and performed a simulation with the void ratio thereof being changed. As a result, the inventor of the present invention has obtained a finding that by controlling the void ratio of the piezoelectric ceramic body to 20 to 75%, the relative permittivity can be decreased to 110 to 1700 and the elastic compliance can be increased to 15 to 150 pm$^2$/N, and thereby the power generation amount can be increased without deteriorating mechanical strength.

The present invention has been made based on such a finding. A piezoelectric generating element in accordance with the present invention is a piezoelectric generating element having an electrode formed on an outer surface of a piezoelectric ceramic body, wherein the piezoelectric ceramic body has a relative permittivity of 110 to 1700, an elastic compliance of 15 to 150 pm$^2$/N, and a void ratio of 20 to 75%.

Preferably, the void ratio in the piezoelectric generating element in accordance with the present invention is 50 to 75%.

Further, a method for estimating the power generation amount of a piezoelectric generating element in accordance with the present invention is a method for estimating the power generation amount of a piezoelectric generating element having an electrode formed on an outer surface of a piezoelectric ceramic body having a predetermined material constant, comprising: modeling the piezoelectric ceramic body as an aggregate of multiple unit cubic cells using one crystal particle constituting the piezoelectric ceramic body as a unit cubic cell, and providing a virtual void portion in the unit cubic cell; and estimating the power generation amount based on the material constant in accordance with a void ratio.

Preferably, the void portion is formed by cutting out a portion of the unit cubic cell in the method for estimating the power generation amount of the piezoelectric generating element in accordance with the present invention.

Also preferably, the material constant includes at least a piezoelectric constant, a relative permittivity, and an elastic compliance in the method for estimating the power generation amount of the piezoelectric generating element in accordance with the present invention.

Advantageous Effects of Invention

According to the piezoelectric generating element in accordance with the present invention, the power generation amount can be significantly increased more than before without deteriorating mechanical strength since the piezoelectric ceramic body has a relative permittivity of 110 to 1700, an elastic compliance of 15 to 150 pm²/N, and a void ratio of 20 to 75% (preferably 50 to 75%).

Further, according to the method for estimating the power generation amount, the piezoelectric ceramic body is modeled as an aggregate of multiple unit cubic cells using one crystal particle constituting the piezoelectric ceramic body as a unit cubic cell, a virtual void portion is provided in the unit cubic cell, and the power generation amount is estimated based on the material constants (piezoelectric constant, relative permittivity, elastic compliance, and the like) in accordance with the void ratio. Accordingly, an approximate power generation amount of the piezoelectric generating element can be obtained merely by considering the material constants, without actually measuring the power generation amount. Therefore, there is no need to design a structure based on large amounts of various experiment data as has been conventionally required, and thus development cost can be reduced and development period can be shortened.

In particular, since the relative permittivity and the elastic compliance depend on the structure of the piezoelectric ceramic body, by controlling the void ratio, the relative permittivity and elastic compliance can be set, and a piezoelectric generating element having a large power generation amount can be obtained.

Further, the void ratio of the piezoelectric ceramic body can be readily obtained based on the thickness of a frame of the unit cubic cell excluding a void by forming the void portion by cutting out a portion of the unit cubic cell.

DESCRIPTION OF EMBODIMENTS

Next, an embodiment of the present invention will be described in detail.

Figure 1:
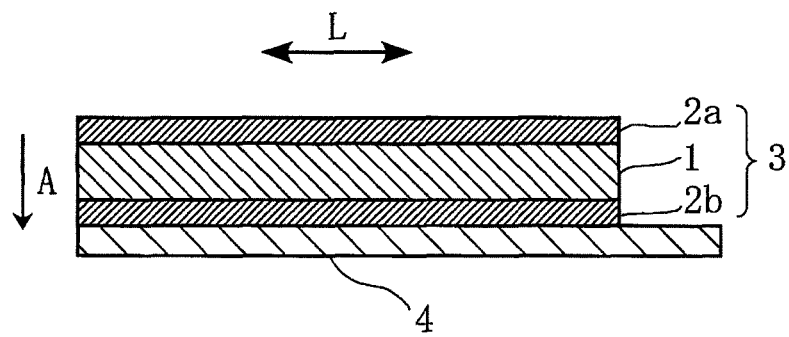
FIG. 1 is a cross sectional view showing one embodiment of a unimorph-type piezoelectric generating element as a piezoelectric generating element in accordance with the present invention.

FIG. 1 is a cross sectional view schematically showing one embodiment of a piezoelectric generating element in accordance with the present invention.

The piezoelectric generating element has a unimorph structure in which a piezoelectric ceramic body 1 mainly composed of a perovskite-type composite oxide such as lead zirconate titanate and electrodes 2a, 2b formed on both main surfaces of piezoelectric ceramic body 1 form an element main body 3, and electrode 2b is affixed to a metal plate 4.

Piezoelectric ceramic body 1 is polarized in a direction indicated by arrow A. When a voltage is applied between electrode 2a and metal plate 4, piezoelectric ceramic body 1 expands and contracts in a direction indicated by an arrow L, and is displaced. Simultaneously when the piezoelectric generating element is displaced in the direction indicated by arrow L, electromotive force is generated and a power generation action occurs.

In the present embodiment, piezoelectric ceramic body 1 is configured to have a relative permittivity of 110 to 1700, an elastic compliance of 15 to 150 pm²/N, and a void ratio of 20 to 75%.

Since the piezoelectric generating element utilizes electromotive force generated by minute vibration of piezoelectric ceramic body 1, the piezoelectric generating element can obtain only a small power generation amount. Therefore, it has been difficult to achieve the practical use of a piezoelectric generating element when it is used alone.

Thus, piezoelectric ceramic body 1 in the present embodiment is intentionally provided with voids and its void ratio is controlled to 20 to 75%, and thereby piezoelectric ceramic body 1 can have a relative permittivity in the range of 110 to 1700 and an elastic compliance in the range of 15 to 150 pm²/N. Accordingly, a power generation amount significantly larger than before can be obtained without deteriorating mechanical strength.

A piezoelectric strain constant d, a relative permittivity $\epsilon r$, and an elastic compliance s are known as material constants of piezoelectric ceramic body 1.

The inventor of the present invention has actually measured the piezoelectric strain constant d, relative permittivity $\epsilon r$, elastic compliance s, and a power generation amount P for multiple piezoelectric generating elements (conventional products), and applied measurement results using a numerical analytical method such as the least-square method. As a result, the inventor of the present invention has found that there is a certain relationship between power generation amount P and piezoelectric strain constant d, relative permittivity $\epsilon r$, and elastic compliance s, and that power generation amount P can be expressed by equation (1):

$$P = A \times d + B/\epsilon r - C/s + D \quad (1),$$

where A, B, C, and D are constants.

As is clear from equation (1), a large power generation amount P can be obtained by increasing piezoelectric strain constant d, decreasing relative permittivity $\epsilon r$, and increasing elastic compliance s.

Piezoelectric strain constant d is a material constant inherent to a piezoelectric ceramic material, whereas relative permittivity $\epsilon r$ and elastic compliance s vary depending on the structure of piezoelectric ceramic body 1.

Thus, attention in the present embodiment is focused on the structure of piezoelectric ceramic body 1, and the void ratio of piezoelectric ceramic body 1 is increased such that relative permittivity εr is decreased and elastic compliance s is increased. Thereby, a power generation amount significantly larger than before can be obtained.

Specifically, a microstructure of piezoelectric ceramic body 1 is modeled, and a concept of a cubic cell is introduced to perform a simulation. Thereby, an optimal range for the void ratio is set.

Figure 2:
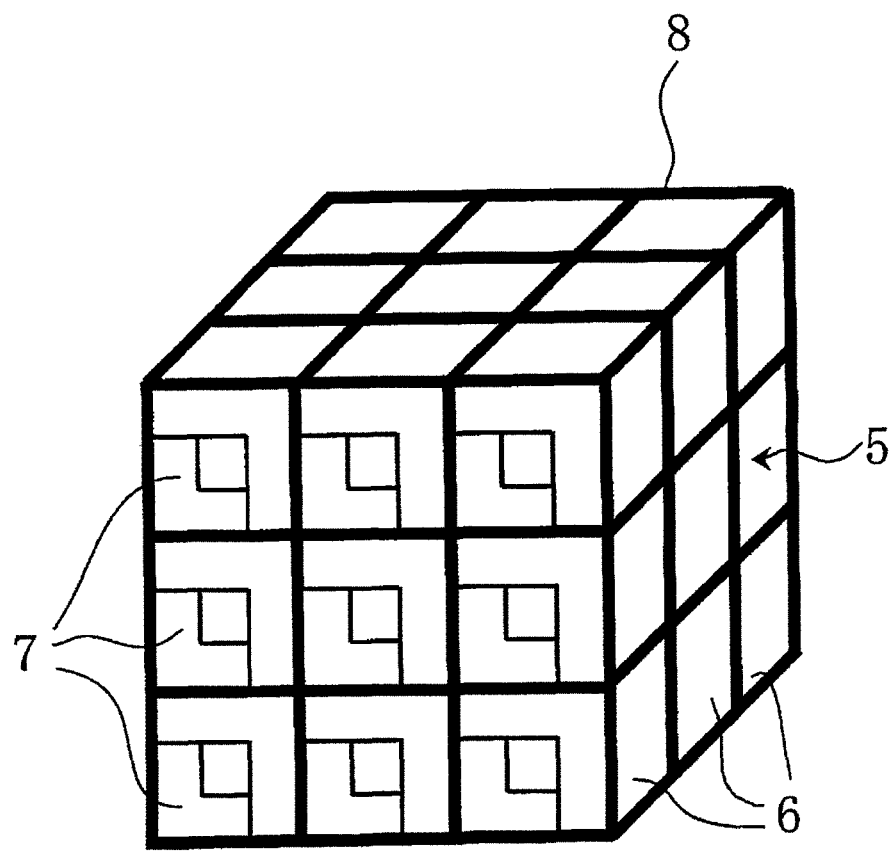
FIG. 2 is a perspective view of a cell aggregate.

FIG. 2 is a perspective view of a cell aggregate.

The cell aggregate includes unit cubic cells 5 connected in a horizontal direction and stacked in a vertical direction. Piezoelectric ceramic body 1 is modeled as an aggregate of multiple unit cubic cells 5 using one crystal particle as unit cubic cell 5.

Figure 3:
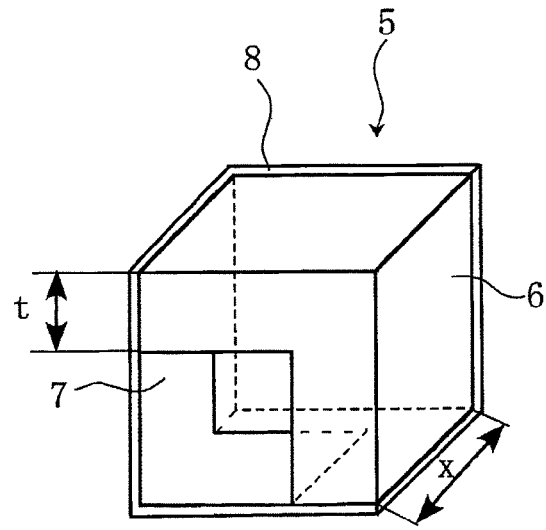
FIG. 3 is a perspective view of a unit cubic cell.

As shown in FIG. 3, unit cubic cell 5 has a cube 6 with a length X on a side corresponding to a crystal particle, a void portion (void) 7 corresponding to a pore, and a gap portion 8 corresponding to a crystal grain boundary.

At void portion 7, one corner portion of cube 6 is cut out in a cubic shape, and the thickness of cube 6 at a portion left after formation of void portion 7 serves as a thickness t of a frame.

Accordingly, thickness t of the frame is decreased as the volume of void portion 7 is increased. In other words, by determining thickness t of the frame, the void ratio for cube 6, that is, one crystal particle can be determined, and further, relative permittivity εr and elastic compliance s can be determined.

In addition, since the piezoelectric strain constant d is a material constant inherent to a piezoelectric ceramic material as described above, by calculating relative permittivity εr and elastic compliance s in accordance with the void ratio, the power generation amount P can be estimated from equation (1) (hereinafter, power generation amount P will be referred to as an estimated power generation amount Pcal).

As a result, and as is clear from examples described later, the relative permittivity can be set to the range of 110 to 1700, and the elastic compliance can be set to the range of 15 to 150 pm$^2$/N by controlling the void ratio to 20 to 75%. Thereby, a piezoelectric generating element having a power generation amount significantly larger than before can be obtained without deteriorating mechanical strength.

If the void ratio is less than 20%, the relative permittivity εr is excessively increased or elastic compliance s is excessively decreased, and thus desired large estimated power generation amount Pcal cannot be obtained. On the other hand, if the void ratio is more than 75%, thickness t of the frame is excessively reduced, and, considering an actual piezoelectric generating element, there is a possibility that mechanical strength is reduced and it becomes difficult to maintain reliability.

Thus, the void ratio of piezoelectric ceramic body 1 in the present embodiment is set to 20 to 75% to thereby obtain a power generation amount twice or more than before.

In particular, when the void ratio is 50 to 75%, it is possible to obtain a large estimated power generation amount Pcal larger than that obtained when the void ratio is 0% by 4.8 times or more.

It is noted that if at least one of relative permittivity εr and elastic compliance s is outside the above range, there is a possibility that sufficient estimated power generation amount Pcal cannot be obtained, or thickness t of the frame is reduced and thus the piezoelectric generating element has a reduced mechanical strength and a deteriorated reliability, which is not preferable.

Since piezoelectric ceramic body 1 has a relative permittivity of 110 to 1700, an elastic compliance of 15 to 150 pm$^2$/N, and a void ratio of 20 to 75% (preferably 50 to 75%) as described above, the power generation amount can be significantly increased more than before without deteriorating mechanical strength.

Further, piezoelectric ceramic body 1 in the present embodiment is modeled as an aggregate of multiple unit cubic cells 5 using one crystal particle constituting piezoelectric ceramic body 1 as unit cubic cell 5, a virtual void is provided in unit cubic cell 5, and the power generation amount is estimated based on the material constants (piezoelectric constant, relative permittivity, elastic compliance, and the like) in accordance with the void ratio. Accordingly, an approximate power generation amount of the piezoelectric generating element can be obtained merely by grasping the material constants, without actually measuring the power generation amount. Therefore, there is no need to design a structure based on large amounts of various experiment data as has been conventionally required, and thus development cost can be reduced and development period can be shortened.

Since relative permittivity εr and elastic compliance s depend on the structure of piezoelectric ceramic body 1, by controlling the void ratio, relative permittivity εr and elastic compliance s can be set, and a piezoelectric generating element having a large power generation amount can be obtained.

Further, the void ratio of piezoelectric ceramic body 1 can be readily obtained based on thickness t of the frame of unit cubic cell 5 excluding void portion 7 by forming void portion 7 by virtually cutting out a portion of unit cubic cell 5.

It is noted that when a piezoelectric generating element is actually fabricated, a piezoelectric generating element having an arbitrary void ratio can be readily obtained by adjusting a firing temperature and reducing sinterability. Therefore, by appropriately selecting a firing temperature to achieve a void ratio of 20 to 75%, a piezoelectric generating element having a desired void ratio can be obtained.

The present invention is not limited to the embodiment described above. Since the present invention aims at increasing the power generation amount by focusing attention on the structure, the piezoelectric ceramic material forming piezoelectric ceramic body 1 is not particularly limited, and a lead-based composite oxide such as lead zirconate titanate (PZT), a non-lead based composite oxide such as an alkali niobate, or the like, can be used.

Although the piezoelectric generating element in the unimorph structure has been illustrated in the embodiment described above, it is needless to say that the present invention can also be applied to a bimorph structure, a monomorph structure, and a stacked structure.

Hereinafter, examples of the present invention will be specifically described.

Example 1

Derivation of Estimated Power Generation Amount Pcal

First, piezoelectric components of sample numbers 1 to 22 having different piezoelectric properties, each having electrodes formed on both main surfaces of a rectangular piezoelectric ceramic body (void ratio: 0%), were prepared. Then, the piezoelectric strain constant $d_{31}$ in a length expansion/contraction mode by means of a resonance/anti-resonance method (hereinafter referred to as "piezoelectric strain constant d"), relative permittivity $\varepsilon_{33}^T/\varepsilon_0$ under a constant stress (hereinafter referred to as "relative permittivity εr"), and an elastic compliance $s_{11}^E$ under a constant electric field (hereinafter referred to as "elastic compliance s") were measured for each piezoelectric component. It is noted that these measurements were performed using an impedance analyzer (HP4294A manufactured by Agilent Technologies).

Figure 4:
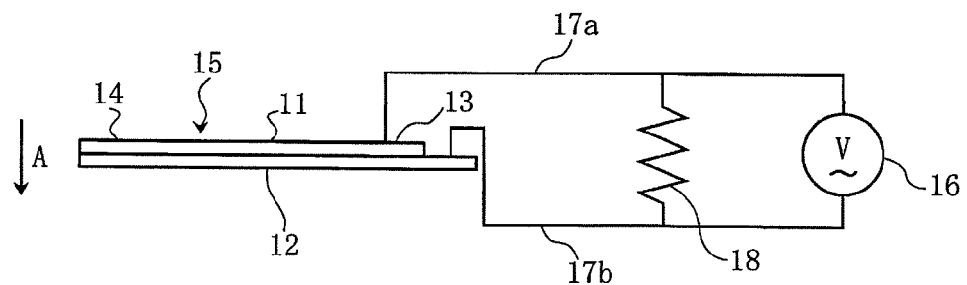
FIG. 4 is a view showing a state where the piezoelectric generating element is connected to a voltmeter.

Next, a metal plate 12 made of brass was affixed to one surface of each of piezoelectric components 11 of sample numbers 1 to 22 to fabricate a piezoelectric generating element 15 in the unimorph structure having one end as a fixed end 13 and the other end as a free end 14 as shown in FIG. 4. Then, an electrode in the vicinity of fixed end 13 was electrically connected to metal plate 12 by conductive wires 17a, 17b via a voltmeter 16. Further, a resistor 18 of RΩ expressed as R=1/(2πC·f), where C is a capacitance of the piezoelectric generating element and f is a drive frequency thereof, was provided in parallel with voltmeter 16 to achieve impedance matching. It is noted that arrow A indicates a direction in which piezoelectric component 11 was polarized.

Figure 5:
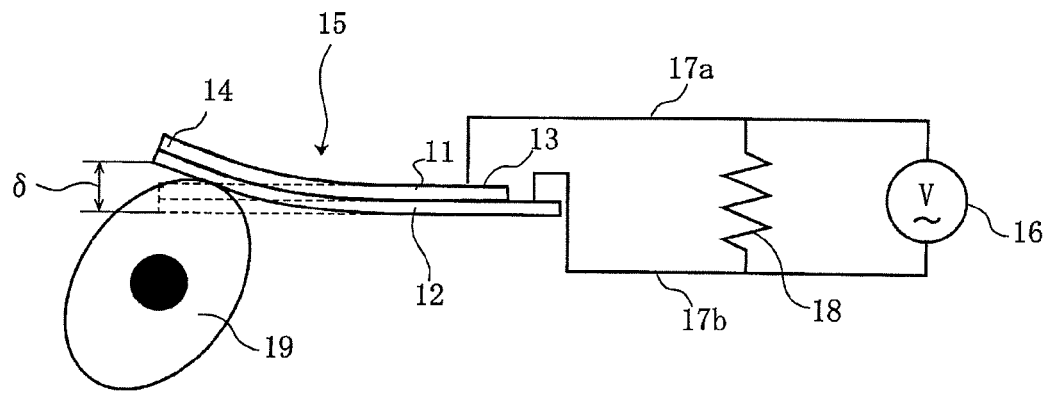
FIG. 5 is a view showing a state where the piezoelectric generating element undergoes displacement.

Subsequently, a cam 19 was caused to abut free end 14 and was rotated at a drive frequency of 10 Hz such that a displacement amount δ at free end 14 would be 0.3 mm, and a maximum instantaneous voltage V generated from piezoelectric generating element 15 was measured with voltmeter 16 as shown in FIG. 5. Then, a power generation amount Preal was determined from equation (2) as a measured power generation amount:

$$Preal = V^2/R \qquad (2).$$

Next, each experiment data of measured power generation amount Preal, piezoelectric constant d, relative permittivity εr, and elastic compliance s was subjected to numerical analysis using the least-square method to obtain a relational expression indicated by equation (3):

$$Pcal = 0.068214 \times d + 51872.32/\epsilon r - 568.25/s + 8.392044 \qquad (3).$$

As is clear from equation (3), estimated power generation amount Pcal depends on piezoelectric constant d, relative permittivity εr, and elastic compliance s, and a larger power generation amount can be obtained with a decrease in relative permittivity εr and with an increase in elastic compliance s.

Table 1 shows measurement results (piezoelectric strain constant d, relative permittivity εr, elastic compliance s, measured power generation amount Pcal) and estimated power generation amount Preal of each of samples of sample numbers 1 to 22.

Figure 6:
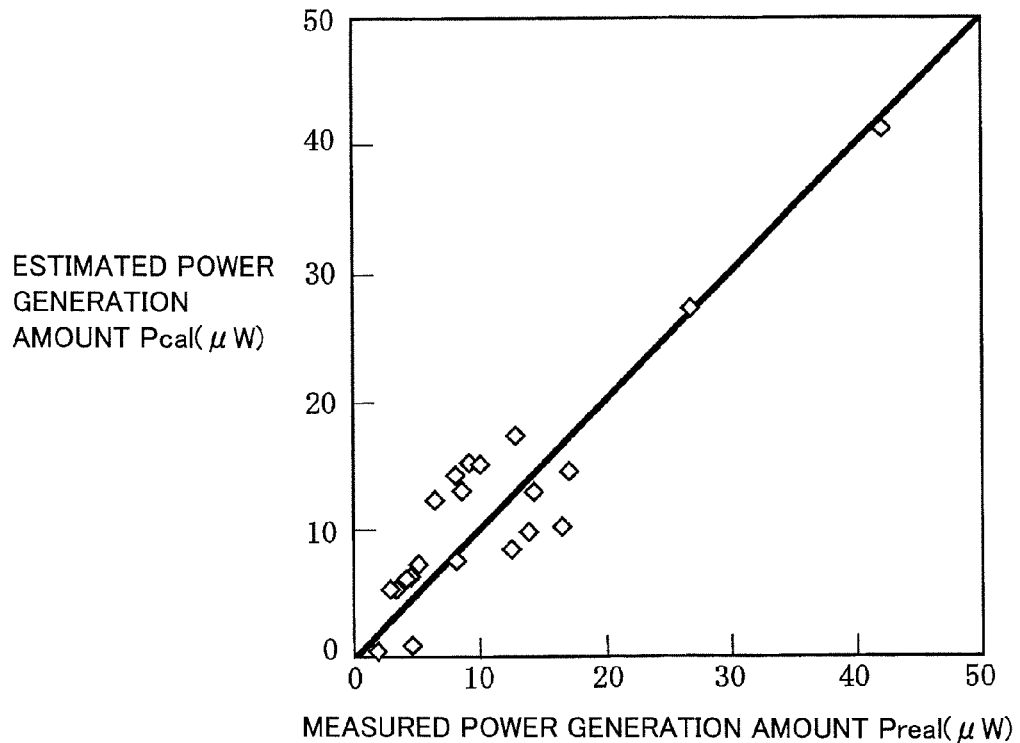
FIG. 6 is a view plotting the relation between a measured power generation amount and an estimated power generation amount in Example 1.

FIG. 6 is a view plotting the relation between estimated power generation amount Pcal and measured power generation amount Preal, in which the axis of abscissas represents measured power generation amount Pcal (μW) and the axis of ordinates represents estimated power generation amount Preal (μW).

As is clear from FIG. 6, it has been found that estimated power generation amount Pcal and measured power generation amount Preal have a substantially linear relationship, and the estimated power generation amount Pcal calculated from equation (3) accurately corresponds to the measured power generation amount Preal.

Therefore, as long as relative permittivity εr and elastic compliance s are known, the power generation amount can be estimated accurately from equation (3) without being actually measured.

Evaluation of Power Generation Amount

For each of the samples of sample numbers 1 to 3, estimated power generation amount Pcal was determined based on equation (3) with the void ratio being changed in the range of 0 to 80%.

Namely, a crystal particle was modeled as a unit cubic cell formed of a cube with 100 μm on a side, and it was assumed that a void portion in a cubic shape having a predetermined volume was present in the unit cubic cell. Then, a void ratio x was calculated based on thickness t of the frame of the cube excluding the void portion, and relative permittivity εr and elastic compliance s were calculated based on void ratio x.

Subsequently, the obtained relative permittivity εr and elastic compliance s, and piezoelectric strain constant d were substituted into equation (3) to determine each estimated power generation amount Pcal.

Table 2 shows material constants (piezoelectric strain constant d, relative permittivity εr, elastic compliance s), thickness t of the frame, and estimated power generation amount Pcal of each sample.

TABLE 1

| Sample No. | Piezoelectric Strain Constant d (pC/N) | Relative Permittivity εr (—) | Elastic Compliance s (pm²/N) | Measured Power Generation Amount Preal (μW) | Estimated Power Generation Amount Pcal (μW) |
| --- | --- | --- | --- | --- | --- |
| 1  | 93  | 707  | 12.1 | 42.2 | 41.3 |
| 2  | 136 | 1043 | 14.2 | 27.0 | 27.4 |
| 3  | 56  | 835  | 9.7  | 10.5 | 15.7 |
| 4  | 101 | 1079 | 12.5 | 13.5 | 17.7 |
| 5  | 108 | 1182 | 12.1 | 14.5 | 12.8 |
| 6  | 194 | 1849 | 16.0 | 8.3  | 14.2 |
| 7  | 177 | 1852 | 16.8 | 17.5 | 14.7 |
| 8  | 170 | 1881 | 17.4 | 9.6  | 15.0 |
| 9  | 112 | 1417 | 12.7 | 8.8  | 7.8  |
| 10 | 162 | 1685 | 14.1 | 14.2 | 9.9  |
| 11 | 127 | 1436 | 12.1 | 4.0  | 6.3  |
| 12 | 221 | 2314 | 17.3 | 8.9  | 13.0 |
| 13 | 227 | 2354 | 17.2 | 6.9  | 12.8 |
| 14 | 135 | 1601 | 12.9 | 4.8  | 6.0  |
| 15 | 211 | 2304 | 16.3 | 16.8 | 10.4 |
| 16 | 101 | 1420 | 11.3 | 2.4  | 1.3  |
| 17 | 204 | 2399 | 16.0 | 12.9 | 8.4  |
| 18 | 160 | 1916 | 13.9 | 3.6  | 5.5  |
| 19 | 217 | 2863 | 15.9 | 3.1  | 5.6  |
| 20 | 301 | 4001 | 16.0 | 4.6  | 6.3  |
| 21 | 358 | 6049 | 16.6 | 5.5  | 7.1  |
| 22 | 306 | 4805 | 14.8 | 4.8  | 1.6  |

Each of the above samples has a void ratio of 0% and is outside the range of the present invention

TABLE 2

| Sample No. | Piezoelectric Strain Constant d (pC/N) | Void Ratio x (%) | Relative Permittivity εr (-) | Elastic Compliance s (pm²/N) | Thickness t of Frame (μm) | Estimated Power Generation Amount Pcal (μW) |
|---|---|---|---|---|---|---|
| 1* | 93 | 0 | 707 | 12.1 | — | 41 |
| 1a* | | 10 | 555 | 14.4 | 115 | 69 |
| 1b | | 20 | 466 | 18.0 | 71 | 95 |
| 1c | | 30 | 391 | 23.1 | 49 | 123 |
| 1d | | 50 | 262 | 41.5 | 26 | 199 |
| 1e | | 70 | 150 | 87.9 | 13 | 353 |
| 1f | | 75 | 116 | 115.8 | 10 | 455 |
| 1g* | | 80 | 99 | 147.5 | 8 | 537 |
| 2* | 136 | 0 | 1043 | 14.2 | — | 27 |
| 2a* | | 10 | 818 | 16.8 | 115 | 47 |
| 2b | | 30 | 576 | 27.1 | 49 | 87 |
| 2c | | 50 | 387 | 48.6 | 26 | 140 |
| 2d | | 70 | 222 | 102.8 | 13 | 246 |
| 2e | | 75 | 183 | 130.6 | 10 | 297 |
| 2f* | | 80 | 145 | 172.6 | 8 | 372 |
| 3* | 56 | 0 | 835 | 9.7 | — | 16 |
| 3a* | | 10 | 582 | 13.0 | 115 | 58 |
| 3b | | 20 | 488 | 15.6 | 71 | 82 |
| 3c | | 30 | 410 | 19.5 | 49 | 110 |
| 3d | | 50 | 275 | 33.9 | 26 | 184 |
| 3e | | 70 | 158 | 70.6 | 13 | 333 |
| 3f* | | 80 | 104 | 118.2 | 8 | 509 |

*outside the range of the present invention

Samples of sample numbers 1a to 1g had various void ratios different from that of the sample of sample number 1.

Although sample number 1a with a low void ratio of 10% had an estimated power generation amount Pcal larger than that of sample number 1 with a void ratio of 0%, it had low elastic compliance s of 14.4 pm²/N, which resulted in insufficient estimated power generation amount Pcal of 69 μW.

Further, although sample number 1g with low relative permittivity εr of 99 had large estimated power generation amount Pcal of 537 μW, it had a high void ratio of 80% and thus had small thickness t of the frame of 8 μm, which resulted in a reduction in mechanical strength and made it difficult to ensure reliability.

In the piezoelectric ceramic body of this type, the crystal particle generally has a grain size of 2 to 3 μm. Accordingly, it is considered that, if the void ratio reaches 80% and thickness t of the frame is extremely reduced to 8 μm or less, there are only two or three particles in a frame portion, which results in a reduction in mechanical strength and makes it difficult to ensure reliability.

In contrast, the void ratio was controlled to the range of 20 to 75% by setting thickness t of the frame to 10 to 71 μm in sample numbers 1b to 1f. By controlling the void ratio to the range of 20 to 75% as described above, a relative permittivity εr of 116 to 466 and elastic compliance s of 18.0 to 115.8 pm²/N were obtained, each of which was in the range of the present invention. Thereby it was possible to significantly increase the power generation amount without causing a reduction in mechanical strength, in sample numbers 1b to 1f. Namely, estimated power generation amounts Pcal of sample numbers 1b to 1f were 2.3 to 11 times larger than that of sample number 1, and it has been found that large estimated power generation amount Pcal of 95 to 455 μW was able to be obtained.

Samples of sample numbers 2a to 2f had various void ratios different from that of the sample of sample number 2.

Although sample number 2a with a low void ratio of 10% had estimated power generation amount Pcal larger than that of sample number 2 with a void ratio of 0%, it had high relative permittivity εr of 818, which resulted in insufficient estimated power generation amount Pcal of 47 μW.

Further, although sample number 2f with high elastic compliance s of 172.6 pm²/N had large estimated power generation amount Pcal of 372 μW, it had a high void ratio of 80% and thus had a small thickness of the frame of 8 μm, which resulted in a reduction in mechanical strength and made it difficult to ensure reliability, for the same reason as described for sample number 1g.

In contrast, the void ratio was controlled to the range of 30 to 75% by setting thickness t of the frame to 10 to 49 μm in sample numbers 2b to 2e. By controlling the void ratio to the range of 30 to 75% as described above, relative permittivity εr of 183 to 576 and elastic compliance s of 27.1 to 130.6 pm²/N were obtained, each of which was in the range of the present invention. Thereby, in sample numbers 2b to 2e, it was possible to significantly increase the power generation amount without causing a reduction in mechanical strength. Namely, estimated power generation amounts Pcal of sample numbers 2b to 2e were 3.2 to 11 times larger than that of sample number 2, and it has been found that large estimated power generation amount Pcal of 87 to 297 μW was able to be obtained.

Samples of sample numbers 3a to 3f had various void ratios different from that of the sample of sample number 3.

Although sample number 3a with a low void ratio of 10% had estimated power generation amount Pcal larger than that of sample number 3 with a void ratio of 0%, it had low elastic compliance s of 13.0 pm²/N, which resulted in insufficient estimated power generation amount Pcal of 58 μW.

Further, although sample number 3f with low relative permittivity εr of 104 had large estimated power generation amount Pcal of 509 μW, it had a high void ratio of 80% and thus had a small thickness of the frame of 8 μm, which resulted in a reduction in mechanical strength and made it difficult to ensure reliability, for the same reason as described for sample number 1g.

In contrast, the void ratio was controlled to the range of 20 to 70% by setting thickness t of the frame to 13 to 71 μm in sample numbers 3b to 3e. By controlling the void ratio to the range of 20 to 70% as described above, relative permittivity εr of 158 to 488 and elastic compliance s of 15.6 to 70.6 pm²/N were obtained, each of which was in the range of the present invention. Thereby, in sample numbers 3b to 3e, it was possible to significantly increase the power generation amount without causing a reduction in mechanical strength. Namely, estimated power generation amounts Pcal of sample numbers 3b to 3e were 5.1 to 20.8 times larger than that of sample number 3, and it has been found that large estimated power generation amount Pcal of 82 to 333 μW was able to be obtained.

Example 2

Derivation of Estimated Power Generation Amount Pcal

As in Example 1, piezoelectric components of sample numbers 31 to 39 having different piezoelectric properties, each having electrodes formed on both main surfaces of a rectangular piezoelectric ceramic body (void ratio: 0%), were prepared. Then, piezoelectric strain constant d, relative permittivity εr, and elastic compliance s were measured for each piezoelectric component, by the same method and procedure as in Example 1.

Next, as in Example 1, a piezoelectric generating element 15 in the unimorph structure was fabricated, an electrode in the vicinity of fixed end 13 was electrically connected to metal plate 12 by conductive wires 17a, 17b via voltmeter 16, and resistor 18 was provided in parallel with voltmeter 16 (see FIG. 4).

Subsequently, as in Example 1, cam 19 was caused to abut free end 14 and was rotated, and maximum instantaneous voltage V generated from piezoelectric generating element 15 was measured with voltmeter 16 (see FIG. 5). It is noted that, in Example 2, cam 19 was rotated at a drive frequency of 20 Hz such that displacement amount δ at free end 14 would be 1.6 mm Then, as in Example 2, power generation amount Preal was determined based on equation (2) described above as a measured power generation amount.

Next, each experiment data of measured power generation amount Preal, piezoelectric constant d, relative permittivity εr, and elastic compliance s was subjected to numerical analysis using the least-square method to obtain a relational expression indicated by equation (4):

$$P\text{cal} = 0.2460 \times d + 219198.723/\epsilon r - 1357.87/s + 0.50023 \quad (4).$$

As is clear from equation (4), estimated power generation amount Pcal depends on piezoelectric constant d, relative permittivity εr, and elastic compliance s, and a larger power generation amount can be obtained with a decrease in relative permittivity εr and with an increase in elastic compliance s as in Example 1, although each coefficient in equation (4) is different from that in equation (3) because displacement amount δ in Example 2 was different from that in Example 1.

Table 3 shows measurement results (piezoelectric strain constant d, relative permittivity εr, elastic compliance s, measured power generation amount Preal) and estimated power generation amount Pcal of each of samples of sample numbers 31 to 39.

TABLE 3

| Sample No. | Piezoelectric Strain Constant d (pC/N) | Relative Permittivity εr (—) | Elastic Compliance s (pm²/N) | Measured Power Generation Amount Preal (μW) | Estimated Power Generation Amount Pcal (μW) |
|---|---|---|---|---|---|
| 31 | 73 | 2464 | 13 | 6 | 3 |
| 32 | 217 | 2863 | 15 | 40 | 40 |
| 33 | 101 | 1420 | 11.3 | 61 | 59 |
| 34 | 206 | 5419 | 16.4 | 8 | 9 |
| 35 | 135 | 1601 | 12.9 | 59 | 66 |
| 36 | 358 | 6049 | 16.6 | 56 | 43 |
| 37 | 127 | 1436 | 12.1 | 66 | 72 |
| 38 | 160 | 1916 | 13.9 | 52 | 57 |
| 39 | 301 | 4001 | 16 | 33 | 44 |

Figure 7:
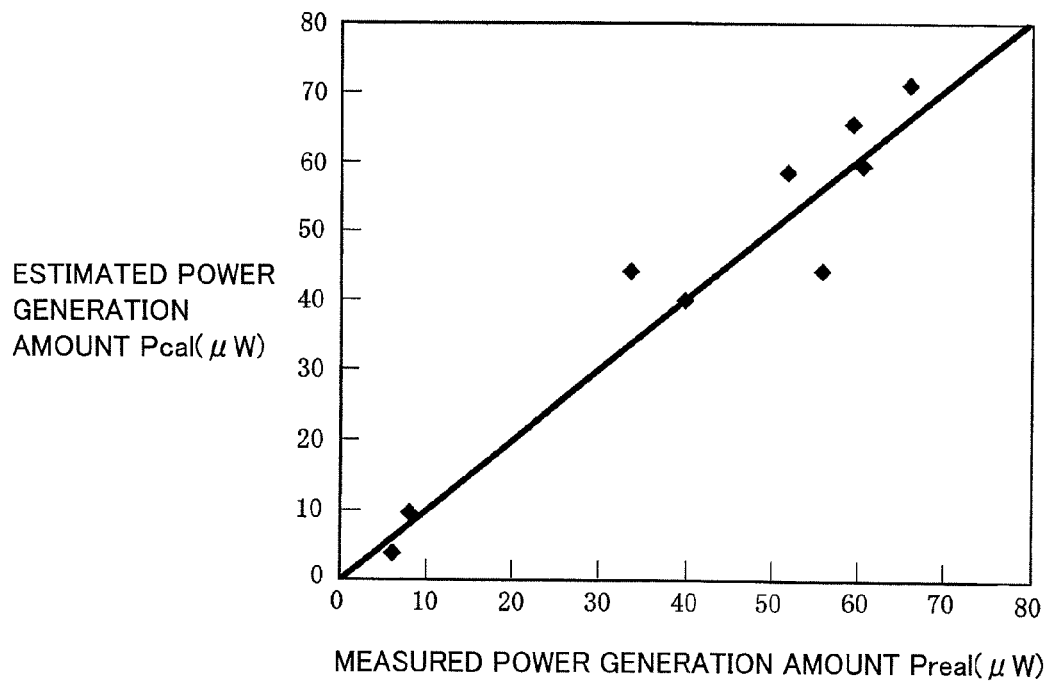
FIG. 7 is a view plotting the relation between a measured power generation amount and an estimated power generation amount in Example 2.

Each of the above samples has a void ratio of 0% and is outside the range of the present invention FIG. 7 is a view plotting the relation between estimated power generation amount Pcal and measured power generation amount Preal, in which the axis of abscissas represents measured power generation amount Peaal (μW) and the axis of ordinates represents estimated power generation amount Pcal (μW).

As is clear from FIG. 7, it has been found that, as in Example 2, estimated power generation amount Pcal and measured power generation amount Preal have a substantially linear relation, and estimated power generation amount Pcal calculated from equation (4) accurately corresponds to measured power generation amount Preal.

Therefore, as in Example 1, as long as relative permittivity εr and elastic compliance s are grasped, the power generation amount can be estimated accurately from equation (4) without being actually measured.

Evaluation of Power Generation Amount

For each of the samples of sample numbers 31 to 33, estimated power generation amount Pcal was determined based on equation (4) with the void ratio being changed in the range of 0 to 80%.

Namely, as in Example 1, a crystal particle was modeled as a unit cubic cell formed of a cube with 100 μm on a side. Then, a void ratio was calculated based on the thickness of a frame of the cube excluding a void portion, and relative permittivity εr and elastic compliance s were calculated based on the void ratio.

Subsequently, the obtained relative permittivity εr and elastic compliance s, and piezoelectric strain constant d were substituted into equation (4) to determine each estimated power generation amount Pcal.

Table 4 shows material constants (piezoelectric strain constant d, relative permittivity εr, elastic compliance s), thickness t of the frame, and estimated power generation amount Pcal of each sample.

TABLE 4

| Sample No. | Piezoelectric Strain Constant d (pC/N) | Void Ratio x (%) | Relative Permittivity εr (-) | Elastic Compliance s (pm²/N) | Thickness t of Frame (μm) | Estimated Power Generation Amount Pcal (μW) |
|---|---|---|---|---|---|---|
| 31* | 73 | 0 | 2464 | 13 | — | 3 |
| 31a* | | 15 | 1769 | 17.2 | 88 | 63 |
| 31b | | 20 | 1622 | 19.3 | 71 | 83 |
| 31c | | 24 | 1513 | 21.2 | 61 | 99 |
| 31d | | 50 | 913 | 44.5 | 26 | 228 |
| 31e | | 70 | 522 | 94.2 | 13 | 424 |
| 31f | | 75 | 431 | 119.6 | 10 | 516 |
| 31g* | | 80 | 342 | 158.1 | 8 | 652 |
| 32* | 217 | 0 | 2863 | 15.9 | — | 40 |
| 32a* | | 10 | 2246 | 17.8 | 115 | 75 |
| 32b | | 30 | 1581 | 30.4 | 49 | 145 |
| 32c | | 50 | 1060 | 54.5 | 26 | 234 |
| 32d | | 70 | 607 | 115.3 | 13 | 403 |
| 32e | | 75 | 501 | 146.5 | 10 | 482 |
| 32f* | | 80 | 397 | 193.6 | 8 | 599 |
| 33* | 101 | 0 | 1420 | 11.3 | — | 59 |
| 33a* | | 2 | 1315 | 11.6 | 268 | 75 |
| 33b | | 20 | 935 | 16.7 | 71 | 178 |
| 33c | | 40 | 650 | 28.4 | 36 | 315 |
| 33d | | 50 | 526 | 38.6 | 26 | 407 |
| 33e | | 75 | 249 | 103.6 | 10 | 894 |
| 33f* | | 80 | 197 | 136.9 | 8 | 1127 |

*outside the range of the present invention

Samples of sample numbers 31a to 31g had various void ratios different from that of the sample of sample number 31.

Although sample number 31a with a low void ratio of 15% had estimated power generation amount Pcal larger than that of sample number 31 with a void ratio of 0%, it had low elastic compliance s of 17.2 pm²/N, which resulted in insufficient estimated power generation amount Pcal of 63 μW.

Further, although sample number 31g with high elastic compliance s of 158.1 pm²/N had large estimated power generation amount Pcal of 652 μW, it had a high void ratio of 80% and thus had small thickness t of the frame of 8 μm, which resulted in a reduction in mechanical strength and made it difficult to ensure reliability, for the same reason as described for sample number 1g in Example 1.

In contrast, the void ratio was controlled to the range of 20 to 75% by setting the thickness of the frame to 10 to 71 μm in sample numbers 31b to 31f. By controlling the void ratio to the range of 20 to 75% as described above, relative permittivity εr of 431 to 1622 and elastic compliance s of 19.3 to 119.6 pm²/N were obtained, each of which was in the range of the present invention. Thereby, in sample numbers 31b to 31f, it was possible to significantly increase the power generation amount without causing a reduction in mechanical strength. Namely, estimated power generation amounts Pcal of sample numbers 31b to 31f were 27.7 to 172 times larger than that of sample number 31, and it has been found that large estimated power generation amount Pcal of 83 to 516 μW was able to be obtained.

Samples of sample numbers 32a to 32f had various void ratios different from that of the sample of sample number 32.

Although sample number 32a with a low void ratio of 10% had estimated power generation amount Pcal larger than that of sample number 32 with a void ratio of 0%, it had high relative permittivity εr of 2246, which resulted in insufficient estimated power generation amount Pcal of 75 μW.

Further, although sample number 32f with high elastic compliance s of 193.6 pm²/N had large estimated power generation amount Pcal of 599 μW, it had a high void ratio of 80% and thus had small thickness t of the frame of 8 μm, which resulted in a reduction in mechanical strength and made it difficult to ensure reliability, for the same reason as described for sample number 1g.

In contrast, the void ratio was controlled to the range of 30 to 75% by setting thickness t of the frame to 10 to 49 μm in sample numbers 32b to 32e. By controlling the void ratio to the range of 30 to 75% as described above, relative permittivity εr of 501 to 1581 and elastic compliance s of 30.4 to 146.5 pm²/N were obtained, each of which was in the range of the present invention. Thereby, in sample numbers 32b to 32e, it was possible to significantly increase the power generation amount without causing a reduction in mechanical strength. Namely, estimated power generation amounts Pcal of sample numbers 32b to 32e were 3.6 to 12 times larger than that of sample number 32, and it has been found that large estimated power generation amount Pcal of 145 to 482 μW was able to be obtained.

Samples of sample numbers 33a to 33f had various void ratios different from that of the sample of sample number 33.

Although sample number 33a with a low void ratio of 2% had estimated power generation amount Pcal larger than that of sample number 33 with a void ratio of 0%, it had low elastic compliance s of 11.6 pm²/N, which resulted in insufficient estimated power generation amount Pcal of 75 μW.

Further, although sample number 33f with low relative permittivity εr of 197 had large estimated power generation amount Pcal of 1127 μW, it had a high void ratio of 80% and thus had small thickness t of the frame of 8 μm, which resulted in a reduction in mechanical strength and made it difficult to ensure reliability, for the same reason as described for sample number 1g.

In contrast, the void ratio was controlled to the range of 20 to 75% by setting the thickness of the frame to 10 to 71 μm in sample numbers 33b to 33e. By controlling the void ratio to the range of 20 to 75% as described above, relative permittivity εr of 249 to 935 and elastic compliance s of 16.7 to 103.6 pm²/N were obtained, each of which was in the range of the present invention. Thereby, in sample numbers 33b to 33e, it was possible to significantly increase the power generation amount without causing a reduction in mechanical strength. Namely, estimated power generation amounts Pcal of sample numbers 33b to 33e were 3 to 15.2 times larger than that of sample number 33, and it has been found that large estimated power generation amount Pcal of 178 to 894 μW was able to be obtained.

Example 3

In Examples 1, and 2 described above, multiple piezoelectric generating elements each having a piezoelectric ceramic body with a void ratio of 0% were fabricated (sample numbers 1 to 22 and 31 to 39), the power generation amount was actually measured for each of the piezoelectric generating elements (measured power generation amount Preal), and the power generation amount was also estimated based on equation (3), (4) (estimated power generation amount Pcal). As a result, it has been confirmed that the both approximated to each other. Namely, it has been found that, as long as relative permittivity εr and elastic compliance s of a piezoelectric element are grasped, power generation amount Pcal can be estimated based on equation (3), (4) without actually measuring the power generation amount.

In Example 3, the piezoelectric ceramic material forming the piezoelectric element of sample number 31 was used to fabricate a sample with a void ratio of 0% (sample number 31') and a sample with a void ratio of 24% (sample number 31c'), and a power generation amount of each sample was evaluated.

Fabrication of Sample Number 31'

The piezoelectric ceramic material forming the piezoelectric element of sample number 31 was prepared.

Then, a ceramic green sheet was fabricated from the piezoelectric ceramic material by a known method. Namely, a binder, a dispersant, and pure water were added to the piezoelectric ceramic material and mixed in a ball mill, and thereafter a sheet was formed using a doctor-blade method to fabricate a ceramic green sheet with a predetermined film thickness.

Next, the ceramic green sheets were stacked to obtain a total thickness of about 2 mm, and the stacked body was pressurized under a pressure of $1.2 \times 10^3$ MPa while being heated to 100° C., to obtain a rectangular plate-shaped stacked compact.

Subsequently, the stacked compact was sufficiently degreased, and then fired at a firing temperature of 1350° C. for five hours, to fabricate a ceramic sintered body of sample number 31'.

Then, void ratio x of the ceramic sintered body was measured. Namely, the measured density y of the sample was determined from a sample weight and a sample volume of the fabricated ceramic sintered body, and void ratio x was determined from measured density y and a theoretical density z, based on equation (5):

$$x = 1 - (y/z) \quad (5).$$

In the ceramic sintered body of sample number 31', the measured density y was substantially equal to theoretical density z, and thus void ratio x was substantially 0%.

Next, the ceramic sintered body was polished to have a thickness of 0.5 mm Thereafter, silver electrodes were formed on both main surfaces thereof, and a diamond cutter was used to cut the ceramic sintered body to 30 mm×10 mm to obtain a piezoelectric ceramic body.

Thereafter, an electric field of 4.0 kV/mm was applied thereto for 30 minutes in an insulating oil at 135° C. to perform polarization treatment, and thereby the sample of sample number 31' was fabricated.

Fabrication of Sample Number 31c'

The sample of sample number 31c' was fabricated by the same method as that for sample number 31' except for performing firing at 1150° C., which was 200° C. lower than that for sample number 31'.

Also for sample number 31c', void ratio x was measured based on equation (5) when a ceramic sintered body was obtained. The ceramic sintered body had a void ratio of 24%, and thus the sample having the same void ratio as that of sample number 31c in Example 2 was obtained.

Next, for sample number 31c', relative permittivity εr, elastic compliance s, and measured power generation amount Preal were measured as in Example 1, and estimated power generation amount Pcal was determined from equation (4).

Table 5 shows the firing temperature and measurement results of each of the samples of sample numbers 31', 31c'. In Table 5, the measurement results of the sample of sample number 31c obtained in Example 2 are shown again.

TABLE 5

| Sample No. | Firing Temperature (° C.) | Piezoelectric Strain Constant d (pC/N) | Void Ratio x (%) | Relative Permittivity εr (-) | Elastic Compliance s (pm²/N) | Measured Power Generation Amount Preal (μW) | Estimated Power Generation Amount Pcal (μW) |
|---|---|---|---|---|---|---|---|
| 31'* | 1350 | 73 | 0 | 2464 | 13.0 | 6 | 3 |
| 31c' | 1150 | 76 | 24 | 1144 | 24.4 | 129 | 157 |
| 31c | — | 73 | 24 | 1513 | 21.2 | — | 99 |

*outside the range of the present invention

As is clear from Table 5, for sample number 31', results which are the same as those of sample number 31 in Example 2 (see Table 4) were obtained.

Further, the relative permittivity εr and elastic compliance s of sample number 31c' approximated to those of sample number 31c, and accordingly, its measured power generation amount Preal also approximated to estimated power generation amount Pcal of sample number 31c. In addition, sample number 31c' had relative permittivity εr of 1144 and elastic compliance s of 24.4 pm²/N, which were each able to be controlled to be in the range of the present invention, and it was possible to obtain measured power generation amount Preal of 129 μW without causing a reduction in mechanical strength. Namely, measured power generation amount Preal of sample number 31c' was 43 times larger than that of sample number 31, and it has been found that the power generation amount can be significantly increased.

Figure 8:
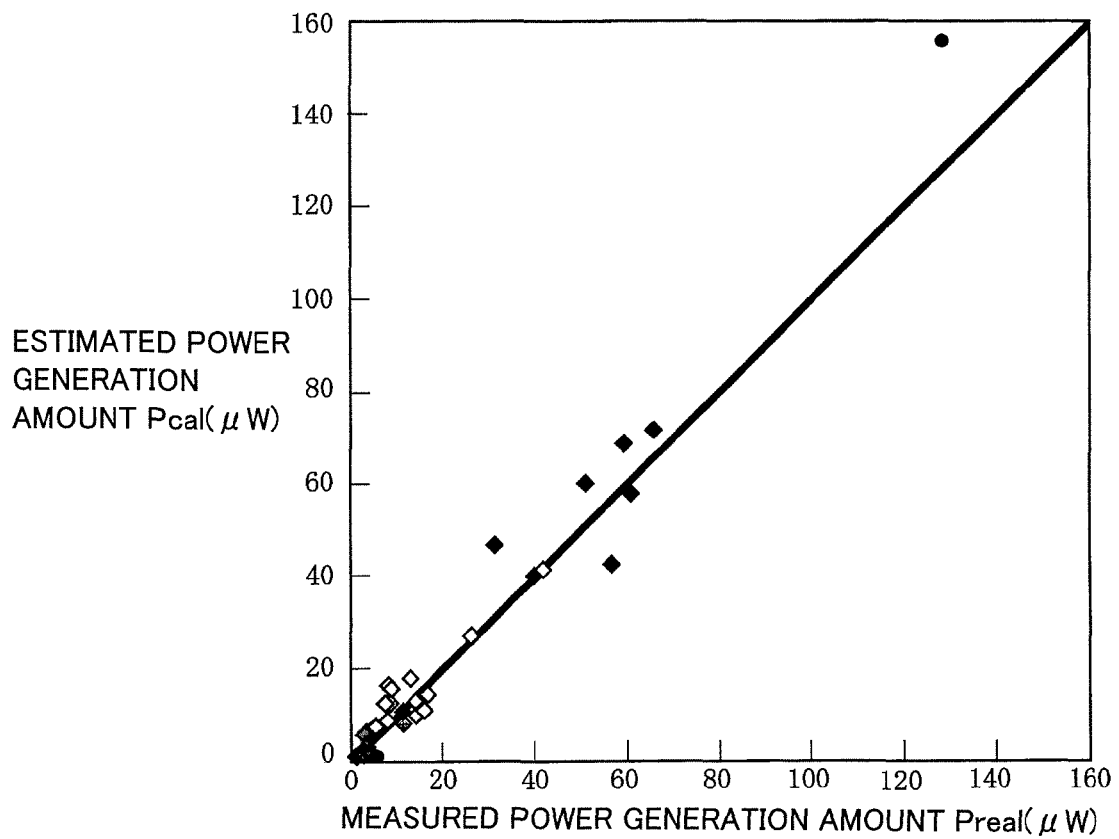
FIG. 8 is a view plotting the relation between a measured power generation amount and an estimated power generation amount in Examples 1 to 3.

FIG. 8 is a view plotting the relation between measured power generation amount Preal and estimated power generation amount Pcal in each of the samples in Examples 1 to 3. White square marks indicate the data of Example 1, black square marks indicate the data of Example 2, and black circle marks indicate the data of Example 3. The axis of abscissas represents measured power generation amount Preal (μW), and the axis of ordinates represents estimated power generation amount Pcal (μW).

As is clear from FIG. 8, as in the actually fabricated samples with a void ratio of 20% or more, estimated power generation amount Pcal and measured power generation amount Preal have a substantially linear relation as in the samples with a void ratio of less than 20%, and validity of equation (1) as a general expression described above has been able to be confirmed.

INDUSTRIAL APPLICABILITY

By setting relative permittivity εr to 110 to 1700, setting elastic compliance s to 15 to 150 pm$^2$/N, and setting the void ratio to 20 to 75%, a piezoelectric generating element having a power generation amount significantly larger than before can be obtained without deteriorating mechanical strength. Further, the power generation amount can be estimated by simulation without being actually measured.

REFERENCE SIGNS LIST

1: piezoelectric ceramic body; 2a, 2b: electrode; 5: unit cubic cell; 7: void portion (void).

The invention claimed is:

1. A piezoelectric generating element comprising a piezoelectric ceramic body having an electrode on an outer surface thereof,
wherein said piezoelectric ceramic body has a relative permittivity of 110 to 1700, an elastic compliance of 15 to 150 pm$^2$/N, and a void ratio of 20 to 75%.

2. The piezoelectric generating element according to claim 1, wherein said void ratio is 30 to 75%.

3. The piezoelectric generating element according to claim 1, wherein said void ratio is 50 to 75%.

4. A method for estimating a power generation amount of a piezoelectric generating element having an electrode formed on an outer surface of a piezoelectric ceramic body having a predetermined material constant, comprising:
modeling said piezoelectric ceramic body as an aggregate of multiple unit cubic cells using one crystal particle constituting said piezoelectric ceramic body as a unit cubic cell, and providing a virtual void portion in said unit cubic cell; and
estimating the power generation amount based on the material constant in accordance with a void ratio.

5. The method for estimating the power generation amount of the piezoelectric generating element according to claim 4, further comprising forming said void portion by cutting out a portion of said unit cubic cell.

6. The method for estimating the power generation amount of the piezoelectric generating element according to claim 5, wherein said material constant includes at least a piezoelectric constant, a relative permittivity, and an elastic compliance.

7. The method for estimating the power generation amount of the piezoelectric generating element according to claim 4, wherein said material constant includes at least a piezoelectric constant, a relative permittivity, and an elastic compliance.

* * * * *